United States Patent [19]

Meissner et al.

[11] Patent Number: 5,047,644

[45] Date of Patent: Sep. 10, 1991

[54] POLYIMIDE THERMAL ISOLATION MESA FOR A THERMAL IMAGING SYSTEM

[75] Inventors: Edward G. Meissner, Dallas; Robert A. Owen, Rowlett; Mary E. Cronin, Dallas, all of Tex.

[73] Assignee: Texas Instruments Incorporated, Dallas, Tex.

[21] Appl. No.: 387,918

[22] Filed: Jul. 31, 1989

[51] Int. Cl.$^5$ ............................................... G01J 5/06
[52] U.S. Cl. ..................................... 250/332; 250/352
[58] Field of Search .................. 250/352, 338.2, 338.3, 250/332, 370.08, 338.4

[56] References Cited

U.S. PATENT DOCUMENTS

| | | | |
|---|---|---|---|
| 4,009,516 | 3/1977 | Chiang et al. | 250/338.3 |
| 4,143,269 | 3/1979 | McCormack et al. | 250/352 |
| 4,147,562 | 4/1979 | Chiang et al. | 250/338.3 |
| 4,214,165 | 7/1980 | Asawa | 250/338.3 |
| 4,354,109 | 10/1982 | Gelpey et al. | 250/338.3 |
| 4,663,529 | 5/1977 | Jenner et al. | 250/338.3 |
| 4,740,700 | 4/1988 | Shaham et al. | 250/332 |
| 4,803,363 | 2/1989 | Gaalema et al. | 250/338.4 |

FOREIGN PATENT DOCUMENTS 193030 8/1986 Japan ............................... 250/338.3

Primary Examiner—Carolyn E. Fields
Attorney, Agent, or Firm—Rene E. Grossman; Melvin Sharp

[57] ABSTRACT

A mesa (31) is formed from polyimide (or a similar polymer material) to achieve a high thermal resistance. In an exemplary thermal imaging application, an array of thermal isolation mesa structures (30) are disposed on an integrated circuit substrate (20) for electrically connecting and bonding a corresponding focal plane array (5) of thermal sensors (10). Each mesa structure (30) includes a polyimide mesa (31) over which is formed a metal conductor (32) that extends from the top of the mesa down a mesa sidewall to an adjacent IC contact pad (22). When the focal plane array (5) is bonded to the corresponding array of thermal isolation mesa structure (30), a thermally isolated, but electrically conductive path is provided between the sensor signal electrode (16) of the thermal sensor (10) and the corresponding contact pad (22) of the integrated circuit substrate (20).

14 Claims, 1 Drawing Sheet

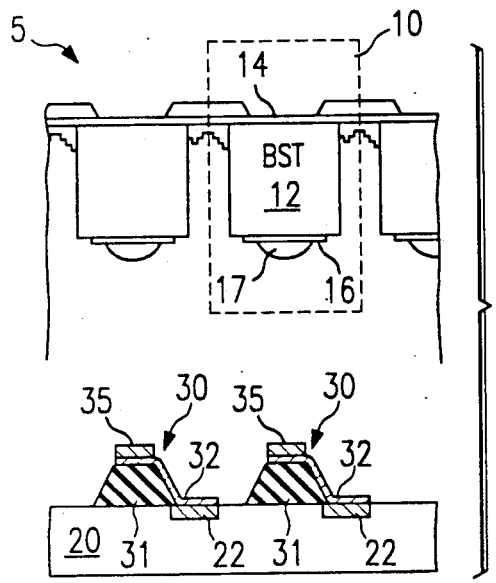
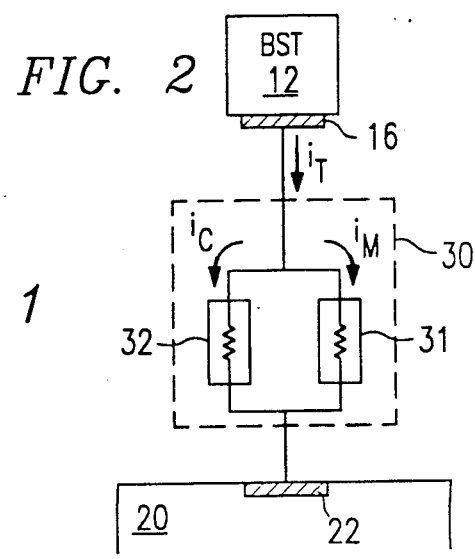
FIG. 1
FIG. 2
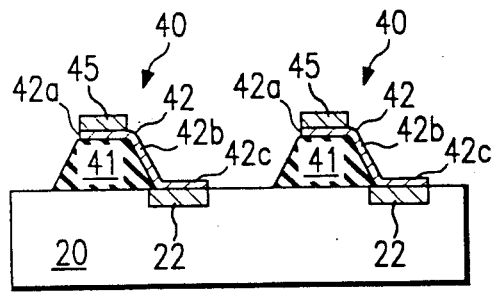
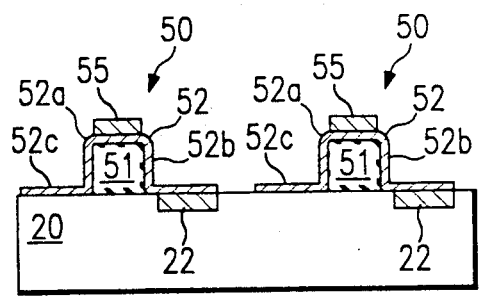
FIG. 3a
FIG. 4a
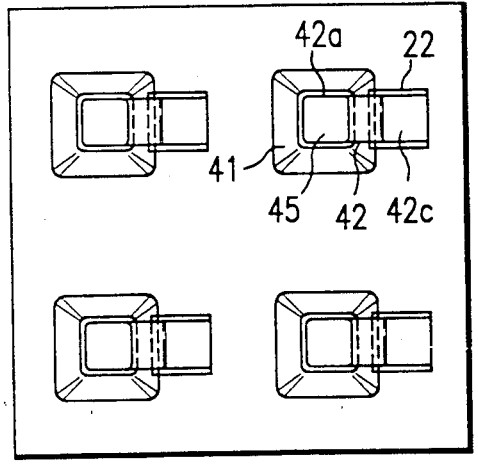
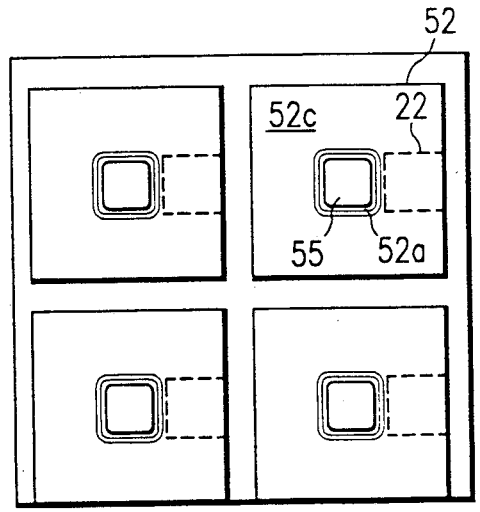
FIG. 3b
FIG. 4b
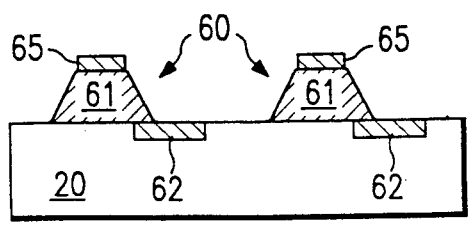
FIG. 5

POLYIMIDE THERMAL ISOLATION MESA FOR A THERMAL IMAGING SYSTEM

TECHNICAL FIELD OF THE INVENTION

This invention relates to thermal isolation structures for solid state systems, and more particularly to a thermal (infrared) imaging system using a polyimide mesa structure and method for providing a thermal-isolation intermediate structure to bond and electrically connect a focal plane array of ferroelectric thermal sensors to the underlying integrated circuit substrate.

BACKGROUND OF THE INVENTION

One common application for thermal sensors is in thermal (infrared) imaging devices such as night vision equipment. One such class of thermal imaging devices includes a focal plane array of ferroelectric thermal sensor elements coupled to an integrated circuit substrate with a corresponding array of contact pads. The thermal sensors define the picture elements (or pixels) of the thermal image.

Each thermal sensor includes a ferroelectric (or pyroelectric) element, which may be a portion of a ferroelectric slab, formed from a ferroelectric material that exhibits a state of electrical polarization that depends upon temperature (such as in response to thermal radiation). On opposing surfaces of the ferroelectric element are disposed an infrared absorber electrode and a sensor signal electrode. A ferroelectric transducer element is formed by the infrared absorber electrode and sensor signal electrodes, which constitute capacitive plates, and the ferroelectric material, which constitutes a dielectric.

The thermal-image sensor signal appearing on the sensor signal electrode depends upon the capacitance of the ferroelectric transducer element, which in turn depends upon incident infrared radiation (temperature). The sensor signals from the thermal sensors in the focal plane array are coupled to an integrated circuit substrate which provides image processing, with each thermal sensor (i.e., each sensor signal electrode) being electrically coupled to a corresponding contact pad.

To maximize thermal response and ensure thermal image accuracy, each ferroelectric thermal sensor of the focal plane array must be thermally isolated from the surrounding focal plane structure, and from the integrated circuit substrate to insure that the associated transducer capacitance accurately represents incident infrared radiation. Thermal-isolation intermediate structures must be disposed between the focal plane array and the integrated circuit substrate to provide a bonding and sensor signal path interface that minimizes thermal diffusion.

The intermediate thermal isolation structure comprises two elements—a conductor element and a thermal isolation element. This general configuration for a thermal isolation structure can be represented by a thermal circuit with two parallel thermal current paths, one through the low-thermal-resistivity conductor and one through the high-thermal-resistivity thermal isolation structure. (See, for example, FIG. 2.) The design goal is to minimize the total thermal current through these two paths.

Several approaches have been used to provide a thermal-isolation intermediate structure for isolating a thermal sensor array from an underlying integrated circuit substrate. One approach is disclosed in U.S. Pat. No. 4,663,529 (Jenner), in which a square grid of channels form a corresponding grid of pillars that define thermal sensor elements. Each pillar or sensor includes a central bore that is coated with a conductive layer. The conductive bores are dimensioned to be less in diameter than corresponding electrode bumps disposed on an integrated circuit substrate, such that when the focal plane array of pillars is disposed over an integrated circuit substrate with a corresponding array of electrode bumps, the conductive bore of each thermal sensor rests on, and is electrically connected to, a corresponding electrode bump. A disadvantage of this architecture is that mating the array of conductive-bore pillars with the corresponding electrode bump array requires close tolerances and exact alignment. Another disadvantage of this architecture is that photoresist is used as the structural material for the pillars, which are therefore structurally fragile and susceptible to damage by solvents.

An alternative approach is disclosed in U.S. Pat. No. 4,143,269 (McCormick), assigned to Texas Instruments Incorporated, the assignee of this invention, where a thermal-isolation intermediate structure for a thermal sensor array uses conductive vias formed in a thermal isolation layer (polyimide) that covers an integrated circuit substrate. In this architecture, vias are formed in the thermal isolation layer, exposing contact pads on the circuit substrate. The sensor signal electrode for a thermal sensor is brought into contact with a corresponding conductive via, providing an electrical connection to the associated contact pad. A disadvantage of this architecture is that so much polyimide is present that total thermal resistance is relatively low. In addition, this architecture requires a relatively large number of process steps, thereby increasing costs.

Heretofore, mesa structures have not been used to thermally isolate the thermal sensors in a focal plane array from an underlying integrated circuit substrate. A mesa is a bump or pillar with a relatively small cross-sectional area that projects from a substrate. Typically, mesa structures are formed by photolithographic techniques (either etch or deposition processes). Mesa structures of materials other than polymer materials (such as polyimides) have been used in the fabrication of solid state devices for such applications as providing arrays of multiprobe contacts or spacers.

Accordingly, a need exists for an improved thermal-isolation intermediate structure that provides a bonding and sensor signal interface between a thermal sensor element and an underlying substrate. An advantageous structure would be capable of fabrication in a relatively few number of process steps.

SUMMARY OF THE INVENTION

The present invention improves thermal isolation between coupled component structures of a solid state system (such as in a thermal imaging system with an array of thermal sensors bonded and electrically coupled to an associated integrated circuit substrate), by providing thermally insulating mesa structures formed on and projecting from one of the component structures.

In one aspect of the invention, the thermal isolation mesa structures are used in a thermal imaging system to couple an array of thermal sensors to a circuit substrate that includes a corresponding array of contact pads. An array of mesa structures, each formed of a thermally insulating polymer material, project from the circuit substrate surface adjacent respective contact pads. Each mesa structure adjacent a contact pad includes a mesa conductor for providing a signal path from the top of the mesa to the contact pad. The thermal sensor array is disposed over the circuit substrate in contact with the mesa array such that, for each thermal sensor, the sensor signal output is coupled through a respective mesa conductor to the associated contact pad.

In its more specific aspects, the thermal isolation mesa structures for a thermal imaging system are formed from a polyimide material. Two alternate configurations are recommended. In the first configuration, each polyimide mesa structure is formed with sloped sidewalls adjacent a respective contact pad of a circuit substrate, and a mesa-to-substrate signal path is provided by a mesa-strip conductor formed over the top of the mesa and down one sidewall, extending over the adjacent integrated circuit contact pad. In the second configuration, the polyimide mesa is formed with substantially vertical sidewalls, and a mesa-to-substrate signal path is provided by a mesa-contour conductor formed over the entire mesa structure and extending onto the adjacent area of the circuit substrate including over the adjacent contact pad.

The thermal imaging system includes a focal plane array of ferroelectric thermal sensors, each including a sensor signal electrode. The focal plane array is coupled to the circuit substrate by bump-bonding, with a bump-bonding conductive material (such as a bump-bonding metal) being provided on the top of each mesa structure and/or on each sensor signal electrode.

The polyimide mesa structure can be photolithographically fabricated using either photosensitive or non-photosensitive polyimide. The recommended fabrication method is to use photosensitive polyimide, forming the mesa structures by patterning a layer of polyimide on photoresist, and then developing the polyimide to remove the unexposed portions, leaving the polyimide mesa structures of the desired configuration and array. After curing, the mesa-to-substrate conductors are formed in conventional metal deposition procedures.

The technical advantages of the mesa structures of this invention include the following. Forming the mesa structures from a polyimide (or other polymer) material provides a high thermal resistivity. In addition, a polyimide material is both compliant and resistant to solvents. For example, in a thermal imaging system, using an array of thermal isolation mesa structures provides an improved intermediate structure for bonding and electrically connecting a focal plane array to an integrated circuit substrate. For such an application, the use of polyimide mesas provides a thermally insulated bonding/signal interface, as well as resistance to solvents and compliant compensation for topological variations. The use of thermal isolation mesa structures allows flexibility in design (including mesa configuration and signal path configuration), and efficiency in fabrication.

BRIEF DESCRIPTION OF THE DRAWINGS

For a more complete understanding of the present invention, and for further features and advantages, reference is now made to the following Detailed Description, taken in conjunction with the accompanying Drawings, in which:

FIG. 1 is an elevation view of a thermal imaging system showing a portion of a focal plane array of thermal sensor elements disposed above (prior to bonding) a corresponding portion of an integrated circuit substrate with a corresponding array of thermal isolation mesas and associated integrated circuit contact pads;

FIG. 2 is a thermal circuit representation of a thermal isolation structure;

FIGS. 3a and 3b are elevation and plan views of a portion of an array of thermal isolation mesas with sloped sidewalls and mesa-strip conductors for electrically connecting the top of the mesa to an associated contact pad;

FIGS. 4a and 4b are elevation and plan views of a portion of an array of thermal isolation mesas with vertical sidewalls and mesa-contour conductors for electrically connecting the top of the mesa to an associated contact pad, and FIG. 5 is an elevation view of a portion of an array of thermal isolation mesas that have been doped conductive to obviate the need for a conductor connection from the top of the mesa to the adjacent contact pad.

DETAILED DESCRIPTION OF THE INVENTION

The Detailed Description of the preferred embodiment of the thermal isolation mesa, and fabrication method, of the present invention is organized as follows:

1. Thermal Isolation Mesa Structure
2. Mesa Structure (Sloped Sidewalls)
3. Mesa Structure (Vertical Sidewalls)
4. Fabrication
5. Additional Embodiments
6. Conclusion The preferred embodiment of this invention is described in connection with an exemplary application for thermal imaging systems. The thermal isolation mesa structure is used to provide a thermally insulated bonding and sensor-signal interface between a focal plane array of thermal sensor elements (ferroelectrical transducers) and an integrated circuit substrate used for image processing. The mesa structure of this invention is readily adaptable to other mesa structure applications.

1. Thermal Isolation Mesa Structure

As shown in FIG. 1, an exemplary thermal imaging system includes an uncooled focal plane array 5 of individual thermal sensor elements 10, together with an integrated circuit substrate 20 that includes a corresponding array of signal contact pads 22. An array of thermal isolation mesa structures 30, formed on the integrated circuit substrate adjacent respective contact pads, provides a thermally insulated intermediate structure for bonding and sensor signal connection.

Each thermal sensor 10 includes a ferroelectric element 12 formed from a suitable ferroelectic material, such as BST (barium-strontium-titanate). On opposing surfaces of ferroelectric element 12 are disposed an infrared absorber electrode 14 and a sensor signal electrode 16. The infrared absorber electrode is comprised of an infrared absorber component and a metal electrode component (not shown separately). Attached to the sensor signal electrode 16 is a metallic bump-bonding material 17 for providing a bump-bond to a corresponding thermal isolation mesa.

For each thermal sensor 10, the ferroelectric element 12, together with its infrared absorber electrode 14 and sensor signal electrode 16, form a ferroelectric transducer. That is, the metal electrode component of the infrared absorber electrode and the sensor signal electrodes constitute capacitor plates, while the ferroelectric material constitutes a dielectric. The capacitors are temperature-dependent, implementing a ferroelectric (or pyroelectric) transducer function. For each thermal sensor electrode 10, thermal (infrared) radiation incident to focal plane array 5 is absorbed by the infrared absorber component and transmits as heat through the metal electrode component of the electrode 14 into the ferroelectric material 12. The resulting temperature change in the ferroelectric material causes a change in the state of electrical polarization, i.e., a change in capacitance. The corresponding sensor signal output available from the sensor signal electrode depends upon the temperature-dependent capacitance of the ferroelectric transducer (i.e., the thermal sensor 10).

The integrated circuit substrate 20 comprises a conventional switching matrix and associated series of amplifiers. This integrated circuit substrate must be bonded to the focal plane array 5, with each contact pad 22 being electrically connected to the sensor signal electrode 16 of a corresponding thermal sensor 10. The purpose of the thermal-isolation intermediate structure is to provide a bonding and sensor-signal interface while maintaining a high degree of thermal isolation. Thermal isolation prevents the integrated circuit substrate 20 from acting as a heat sink for the thermal energy stored in the ferroelectric elements of the thermal sensors, adversely affecting transducer capacitance and sensor signal accuracy.

In accordance with this invention, the thermal isolation structure for bonding and electrically connecting focal plane array 5 to the integrated circuit substrate 20 is provided by an array of thermal isolation mesa structures 30. A thermal isolation mesa structure 30 includes a mesa formed from polyimide, an electrically and thermally insulating polymer material that exhibits a high degree of thermal resistance, and is highly resistant to solvents. In addition, the polyimide is sufficiently compliant to allow for a certain amount of topological variation, thereby reducing dimensional tolerance requirements, without adversely impacting structural capability.

While polyimide is the recommended material for these mesas, other organic materials can be used. The primary design factors used in selecting an appropriate mesa material are thermal resistance and compliance, as well as cost and ease of fabrication.

Each thermal isolation mesa structure 30 includes a polyimide mesa 31 formed adjacent a contact pad 22. A metal conductor 32 provides a signal path between the top of the mesa and the adjacent contact pad. The recommended material for the mesa-to-substrate conductor is titanium because of low thermal conductivity and ease of application.

A bump-bond metal 35 is formed onto the top of the thermal isolation mesa structure 30, i.e., over the top portion of the mesa-to-substrate conductor 32. Bump-bonding metal 35 is selected to be compatible with bump-bonding metal 17 on the sensor signal electrode 16. That is, for a conventional bump-bonding procedure, metals 17 and 35 are selected to provide a good conductive bond between the signal sensor electrode 16 of a thermal sensor 10, and the mesa-to-substrate conductor 32 of the corresponding thermal isolation mesa structure 30, thereby providing a good signal connection between the thermal sensor and the associated contact pad.

The configurations of the polyimide mesa 31 and the associated mesa-to-substrate conductor 32 are design choices, largely dependent upon thermal isolation and structural rigidity considerations. As shown in FIG. 2, a thermal isolation mesa structure 30 can be represented as a thermal circuit connected between the sensor signal electrode 16 (ignoring the bump-bonding metals 17 and 35), and the associated contact pad 22. A thermal current $i_T$ flows through the thermal circuit 30 (corresponding to the thermal isolation mesa structure) in two parallel thermal current paths—a conductor component $i_C$ flows through a mesa-to-substrate-conductor thermal resistance 32, while a mesa component $i_M$ flows through a mesa thermal resistance 31. The design goal is to maximize the total thermal resistance presented by the mesa-to-substrate conductor 32 and the mesa 31, thereby minimizing the total thermal current $i_T$ (i.e., $i_C$ and $i_M$)

The thermal current through a material depends upon the thermal conductivity of the material and the volume of material (thermal capacitance). For the mesa structure 31, the polyimide exhibits very low thermal conductivity (i.e., very high thermal resistivity). The size of the mesa will typically be dictated primarily by structural and thermal capacitance considerations, so that the thermal-current mesa component $i_M$ through the mesa structure 31 will typically be dictated primarily by structural requirements that determine the minimum allowable size of the mesa structure.

The mesa-to-substrate conductor 32 inevitably will exhibit a relatively low thermal resistivity (whatever conductive material is selected), and therefore a relatively high thermal conductivity. Accordingly, to increase the total thermal resistance provided by the mesa-to-substrate conductor 32, and therefore minimize the corresponding thermal-current conductor component $i_C$, the conductor must be configured with as small a cross sectional area to length aspect ratio as possible.

The recommended design approach is to first specify the structural and thermal capacitance requirements for the mesa 31, which will determine its total area and volume. Once the mesa configuration is selected, its thermal resistance will be established, thereby establishing a corresponding thermal-current mesa component $i_m$. Once this thermal current component is established, a configuration for the mesa-to-substrate conductor 32 is selected to achieve an overall thermal resistance that meets the thermal isolation requirements for a thermal sensor 10.

Two alternative configurations for mesa 31 are described below—a mesa with sloping sidewalls, and a mesa with vertical sidewalls. For the sloped-sidewall mesa, a mesa-strip configuration for the conductor 32 is recommended (see Section 2), while for the vertical-sidewall mesa, a mesa-contour configuration for the conductor is recommended (see Section 3). These configurations are exemplary only, and other configurations for both the mesa structure and the mesa-to-substrate conductor are apparent to those skilled in the art. In particular, while both mesa configurations are shown as symmetrical in horizontal and vertical cross section, such symmetry is not required.

Neither the focal plane array of thermal sensors, nor the integrated circuit substrate form any part of the present invention. Likewise, the method of bonding the focal plane array to the intermediate thermal-isolation mesa structure, including the selection of bump-bonding, forms no part of the present invention. In particular, conventional bump-bonding techniques with bump-bonding metals such as indium and lead alloys may be used. Alternatively, a conductive epoxy may be substituted.

The thermal isolation mesa structure of this invention is readily adaptable to thermal imaging systems in general to provide a thermally insulating bonding/conducting interface between a focal plane array of thermal (ferroelectric) sensors and the associated integrated circuit substrate. Morevover, the mesa structure of the present invention has general applicability beyond thermal imaging devices (see Section 5).

2. Mesa Structure (Sloped Sidewalls)

FIGS. 3a and 3b show enlarged elevation and plan views of a portion of an array of thermal isolation mesa structures in accordance with this invention, configured with a mesa-strip conductor between the top of the mesa and the integrated circuit substrate.

Thermal isolation mesa structures 40 include a polyimide mesa 41 and a mesa-strip conductor 42. The mesa-strip conductor 42 is formed from a strip of conductive material that includes a top portion 42a, a sidewall portion 42b and a contact-pad portion 42c that form a continuous mesa-to-substrate conductor strip. The mesa-to-substrate conductor may be formed from any suitable conductive material, with a metallic material (such as titanium) being recommended.

The sloped-sidewall contour for mesa 41 facilitates the formation of a mesa-to-substrate conductor 42 in the strip configuration. That is, the sloped-sidewall contour makes the transition areas between the mesa-top portion 42a and the mesa-sidewall portion 42b, and between the mesa-sidewall portion 42b and the contact-pad portion 42c, less abrupt, and therefore facilitates forming a continuous conductive-strip layer by normal fabrication processes.

As described in Section 1, selecting an appropriate width and thickness for the mesa-strip conductor 42 is a design choice, subject to the design goal of minimizing thermal current through the conductor while maintaining adequate electrical conductivity. Since any conductive material chosen for the mesa-strip conductor 42 will exhibit significantly greater thermal conductivity than the polyimide mesa 41, minimizing thermal current through the conductor (i.e., maximizing the conductor's thermal resistance) requires minimizing the cross-sectional area-to-length aspect ratio of the conductor strip, taking into account structural and electrical requirements. One design approach is to make the mesa-strip conductor comparable in width to the top of mesa 41, and then select an appropriate thickness for the conductor to provide the overall thermal isolation required by the thermal sensor.

A bump-bond metal 45 is disposed over the mesa-top portion 42a of the mesa-strip conductor 42. As described in Section 1, the selection of a bump-bond metal, and the selection of bump-bonding, are design choices for thermal imaging applications of the mesa structure of this invention. The inclusion of a bump-bonding metal is exemplary.

3. Mesa Structure (Vertical Sidewall)

FIGS. 4a and 4b show enlarged elevation and plane views of a portion of an array of thermal isolation mesas with mesa structures having substantially vertical sidewalls, and with a mesa-contour conductor for providing the mesa-to-substrate conductive path to the integrated circuit substrate.

A mesa 51 with substantially vertical sidewalls is disposed on the integrated circuit substrate adjacent contact pad 22. A mesa-contour conductor 52 is formed over the mesa 51, extending over the substrate area adjacent the mesa, including the contact pad.

Mesa-contour conductor 52 includes a mesa-top portion 52a, a mesa-sidewall portion 52b and a substrate portion 52c, forming a mesa-to-substrate conductive path. The mesa-to-substrate conductor may be formed of any suitable conductive material, with a metallic material (such as titanium) being recommended.

A mesa-contour configuration for a mesa-to-substrate conductor is recommended because that configuration is easier to fabricate over a mesa structure with vertical sidewalls. That is, if the vertical sidewall configuration for mesa 51 is selected rather than the sloped sidewall configuration shown in FIG. 3a, a strip mesa-to-substrate conductor is more difficult to fabricate because of the abrupt transitions between the mesa-top portion 52a and the sidewall portion 52b, and between the mesa-sidewall portion 52b and the substrate portion 52c. With current metal deposition processes, forming the mesa-to-substrate conductor as a contour layer facilitates reliably controlling thickness, uniformity and continuity. The mesa-contour configuration for conductor 52 is, thus, a design choice resulting from constraints in fabrication processes—with the appropriate selection of a strip-deposition procedure, a strip configuration for conductor 52 could be used for a mesa structure with vertical sidewalls.

As described in Section 1, and as in the case of the mesa-strip configuration for a mesa-to-substrate conductor, the selection of contour area and thickness for the mesa-contour conductor 52 is a design choice that depends upon thermal resistance and fabrication considerations. That is, the thickness and total area of the mesa-contour conductor is selected to achieve a desired amount of thermal resistance, within practical processing constraints, for the conductive material selected.

From Section 1, the recommended design approach is to configure the mesa-contour conductor 52 to exhibit the thermal resistance required by the thermal sensors. Because the mesa-contour configuration for a mesa-to-substrate conductor requires considerably greater area than the strip configuration described in Section 2, achieving comparable thermal resistance for the two conductor configurations necessarily requires that the mesa-contour conductor 52 be considerably thinner than a strip configuration. That is, assuming a vertical sidewall mesa comparable in size and thermal resistance to a sloped-sidewall mesa, then the mesa-contour conductor 52 should be made comparable in thermal resistance to the mesa-strip conductor (42 in FIG. 3a), thereby requiring that the mesa-contour conductor be significantly thinner than the mesa-strip conductor.

A bump-bond metal 55 is disposed over the mesa-top portion 52a of the mesa-contour conductor 52. As described in Section 1, the selection of a bump-bond metal, and the selection of bump-bonding, are design choices for thermal imaging applications of the mesa structure of this invention. The inclusion of a bump-bonding metal is exemplary.

4. Mesa Structure Fabrication

The mesa structures of the present invention, including the exemplary thermal isolation mesas for a thermal imaging system, are fabricated using conventional photolithographic techniques. Two separate fabrication methods are described, one using photosensitive polyimide and one using non-photosensitive polyimide. The fabrication method using photosensitive polyimide is recommended, because it uses fewer process steps.

The first step is to apply the polyimide (photosensitive or non-photosensitive) to an integrated circuit substrate, spinning the substrate to flow the polyimide over the substrate to a uniform thickness.

For the recommended fabrication method using photosensitive polyimide, the polyimide is then exposed using a mask that patterns the polyimide layer. The exposed polyimide is developed using an appropriate solvent to remove the non-exposed polyimide, leaving the patterned array of polyimide mesas (each adjacent to a respective contact pad on the integrated circuit substrate). Sidewall configuration is determined by appropriate exposure and development techniques. The assembly is then cured in an appropriate heat-curing process to stabilize and harden the array of polyimide mesas.

For the alternate fabrication method using non-photosensitive polyimide, the spun polyimide layer is first cured to harden and stabilize the polyimide. A layer of metal is then applied over the surface, and photolithographically patterned and etched to create a metal mask. The unmasked polyimide is etched, and then the metal mask is removed by etching. The remaining polyimide forms the array of mesa structures adjacent respective contact pads. In this case, sidewall configuration is determined by the organic etch chemistry. This alternate fabrication method is less desirable than the recommended fabrication method because of the additional metallization steps required.

Once the array of polyimide mesa structures is defined, the mesa-to-substrate conductors are formed using conventional photolithographic techniques. That is, the mesa-to-substrate conductors, either in the strip configuration of FIG. 3a or the contour configuration of FIG. 4a, are formed by either an etch process or a lift process using patterned photoresist. The mesa-to-substrate conductors are formed over the mesa structures, and the adjacent contact pad, to a desired thickness.

The thermal isolation mesas are then complete. Additional fabrication steps may be employed to deposit bump-bond metals or conductive epoxies to the top of a mesa (i.e., to the mesa-top portion of a mesa-to-substrate conductor) as appropriate. These additional fabrication steps are accomplished conventionally, with conventional materials the selection of which depends upon the specific application for the mesa structures of this invention.

The thickness of the metal layers used to form the mesa-to-substrate conductors is selected to provide conductors of a predetermined thickness corresponding to the conductor configuration selected and to achieve a selected conductor thermal resistance, as described in Sections 2 and 3.

Additional steps to insert additives into the polyimide material can be used to achieve certain performance criteria. For example, thermal expansion additives can be added to reduce thermal expansion, and therefore reduces stresses at the mesa/conductor interface. In addition, foaming additives can be used to reduce thermal conductivity and mass.

Either of the described methods for fabricating mesa structures in accordance with this invention uses significantly fewer process steps than required to fabricate other thermal isolation structures. For example, for the via structure described in the Background portion of this specification, about 60 process steps are needed to form the thermal isolation structure on the integrated circuit substrate (i.e., prior to any bump-bonding or other bonding procedures). In contrast, the recommended fabrication method using photosensitive polyimide requires about 10 process steps, while the alternate fabrication method using non-photosensitive polyimide requires about 25 process steps.

5. Additional Embodiments

The precise structural configuration, and associated fabrication method, for mesa structures in accordance with this invention are significantly dependent upon the application chosen for the mesa structures. Even within a particular application, such as the exemplary thermal imaging systems, numerous design choices will be routinely implemented by those skilled in the art. The basic mesa structure uses polyimide (or a similar polymer material) to provide mesa structures with a high thermal resistance and an acceptable amount of compliance.

Other applications for mesa structures in accordance with this invention include probe devices and spacers. While a multiprobe device fabricated using mesa structures will likely include a mesa-to-substrate conductor, a spacer application probably would not require that component (or the associated fabrication procedure). In either case, compliance characteristics will compensate for topological variations, and thermal insulation will be provided.

For larger mesa structures, an alternative fabrication method could use screen printing rather than a photolithographic procedure. A screen mask that defines the mesa structures would be disposed over a substrate, and the polyimide forced through the holes in the screen to produce the desired array of mesa structures.

FIG. 5 illustrates an alternative embodiment in which the metallic conductors (either strip or contour) are obviated by implanting or impregnating the polyimide (or other polymer) with a suitable dopant to induce electrical conductivity. Such a procedure would eliminate the conductor forming steps—the mesa structure 61 would merely be configured with at least a portion located over a corresponding integrated circuit contact pad, 62 with electrical conductivity from the top of the mesa 65 to the contact pad being provided by the dopant induced conductivity. Using a dopant to induce conductivity would necessarily decrease the thermal resistance of the polyimide, leading to a design trade-off between thermal resistance and electrical conductivity.

6. Conclusion

The thermal isolation mesas of this invention use polyimide (or a similar polymer material) to achieve a high degree of thermal resistance for the mesa structure. For the exemplary application for thermal imaging systems, the mesa structures are fabricated with a mesa-to-substrate conductor (either a strip or contour configuration) to provide an electrical connection between an array of thermal sensors, and a corresponding array of integrated circuit contact pads, while thermally isolating the focal plane array from the integrated circuit substrate.

In addition to providing a high degree of thermal isolation, the polyimide mesa structures are sufficiently compliant to accommodate the topological variations in the mesa structures and the underlying substrate on which they are formed, thereby reducing tolerance and alignment requirements. The polyimide mesa structures can be fabricated using either photosensitive or non-photosensitive polyimide; in either case, the number of fabrication steps for the mesa structures is significantly fewer than the fabrication steps required for alternative thermal isolation configurations.

Although the present invention has been described with respect to a specific, preferred embodiment, various changes and modifications may be suggested to one skilled in the art, and it is intended that the present invention encompass such changes and modifications as fall within the scope of the appended claims.

What is claimed is:

1. A thermal imaging system including an array of thermally insulating mesa structures, comprising:

an array of thermal sensors, each for providing a sensor signal output representative of the amount of thermal radiation incident to the sensor;

a circuit substrate having disposed on a substantially planar surface an array of signal contact pads for receiving the sensor signal outputs from the array of thermal sensors;

an array of mesa structures, formed of a thermally insulating polymer material, projecting from the substantially planar surface of said circuit substrate, at least one being disposed adjacent each signal contact pad; and for each mesa structure disposed adjacent a signal contact pad, a contoured mesa conductor, extending from the top of the mesa down the sidewalls to cover the adjacent area of said circuit substrate including said corresponding signal contact pad, for providing a signal path between the top of said mesa structure and a respective contact pad;

said thermal sensor array being disposed over said circuit substrate in contact with said array of thermally insulating mesa structures such that, for each thermal sensor, the sensor signal output is coupled through a respective mesa conductor to the associated contact pad.

2. The system of claim 1, wherein said array of thermal sensors comprises an array of individual thermal sensor elements, each including a thermal radiation absorber.

3. The system of claim 1, wherein the polymer material comprises polyimide.

4. The system of claim 1, wherein said mesa conductor is flexibly deformable, thereby compensating for topological variations.

5. A thermal imaging system including an array of thermally insulating mesa structures, comprising:

an array of thermal sensors, each for providing a sensor signal output representative of the amount of thermal radiation incident to the sensor;

a circuit substrate having disposed on a substantially planar surface an array of signal contact pads for receiving the sensor signal outputs from the array of thermal sensors;

an array of polyimide mesa structures, formed of photosensitive polyimide material, projecting from the substantially planar surface of said circuit substrate, at least one being disposed adjacent each signal contact pad; and for each mesa structure disposed adjacent a signal contact pad, a mesa conductor for providing a signal path between the top of said mesa structure and a respective contact pad;

said thermal sensor array being disposed over said circuit substrate in contact with said array of thermally insulating mesa structures such that, for each thermal sensor, the sensor signal output is coupled through a respective mesa conductor to the associated contact pad.

6. The system of claim 5, wherein said array of thermal sensors comprises an array of individual thermal sensor elements, each including a thermal radiation absorber.

7. The system of claim 5, wherein each mesa conductor comprises a strip of conductive material extending from the top of the mesa down a sidewall to said adjacent signal contact pad on said circuit substrate.

8. The system of claim 7, wherein each thermally insulating mesa structure is configured with sloped sidewalls.

9. The system of claim 5, wherein each mesa conductor comprises a contoured layer of conductive material extending from the top mesa down the sidewalls to cover the area of said circuit substrate adjacent said mesa structure, including to said adjacent signal contact pad.

10. The system of claim 5, wherein said mesa conductor is formed by inducing conductivity in the mesa itself by adding appropriated dopants, said mesa structure being configured to cover at least a portion of said adjacent signal contact pad.

11. A thermal imaging system including an array of thermally insulating mesa structures, comprising:

an array of thermal sensors, each for providing a sensor signal output representative of the amount of thermal radiation incident to the sensor;

a circuit substrate having disposed on a substantially planar surface an array of signal contact pads for receiving the sensor signal outputs from the array of thermal sensors;

an array of mesa structures, formed of a thermally insulating polymer material, projecting from the substantially planar surface of said circuit substrate, at least one being disposed adjacent to, and covering at least a portion of, each signal contact pad; and each mesa structure being doped conductive for providing a signal path between the top of said mesa structure and a respective contact pad;

said thermal sensor array being disposed over said circuit substrate in contact with said array of thermally insulating mesa structures such that, for each thermal sensor, the sensor signal output is coupled through a respective conductive mesa structure to the associated contact pad.

12. The system of claim 11, wherein said array of thermal sensors comprises an array of individual thermal sensor elements, each including a thermal radiation absorber.

13. The system of claim 11, wherein the polymer material comprises polyimide.

14. The system of claim 11, wherein said mesa structure is flexibly deformable, thereby compensating for topological variations.

* * * * *